United States Patent [19]
Murphy

[11] Patent Number: 6,007,348
[45] Date of Patent: Dec. 28, 1999

[54] SOLDER BALL TERMINAL

[75] Inventor: James V. Murphy, Warwick, R.I.

[73] Assignee: Advanced Intercommunications Corporation, West Warwick, R.I.

[21] Appl. No.: 09/094,957

[22] Filed: Jun. 15, 1998

Related U.S. Application Data

[63] Continuation-in-part of application No. 08/694,740, Aug. 9, 1996, which is a continuation-in-part of application No. 08/646,109, May 7, 1996.

[51] Int. Cl.$^6$ .................................................. H01R 9/09
[52] U.S. Cl. .................................................. 439/70
[58] Field of Search .................... 439/69, 70, 71, 439/83, 525

[56] References Cited

U.S. PATENT DOCUMENTS

| | | | |
|---|---|---|---|
| 2,740,075 | 3/1956 | Walker et al. | 317/234 |
| 3,989,331 | 11/1976 | Hanlon | 439/70 |
| 4,037,270 | 7/1977 | Ahmann et al. | 361/385 |
| 4,251,852 | 2/1981 | Ecker et al. | 361/386 |
| 4,396,935 | 8/1983 | Schuck | 357/74 |
| 4,442,938 | 4/1984 | Murphy | 206/329 |
| 4,519,658 | 5/1985 | Biswas | 439/68 |
| 4,767,344 | 8/1988 | Noschese | 439/83 |
| 4,843,313 | 6/1989 | Walton | 324/158 |
| 4,854,882 | 8/1989 | Corridori | 439/83 |
| 4,893,172 | 1/1990 | Matsumoto et al. | 357/79 |
| 4,897,918 | 2/1990 | Osaka et al. | 29/830 |
| 4,916,523 | 4/1990 | Sokolovsky et al. | 357/74 |
| 4,949,455 | 8/1990 | Nakamura et al. | 29/843 |
| 5,006,792 | 4/1991 | Malhi et al. | 324/158 |
| 5,031,025 | 7/1991 | Braun et al. | 357/74 |
| 5,055,914 | 10/1991 | Shimizu et al. | 357/81 |
| 5,061,984 | 10/1991 | Schraivogel et al. | 357/68 |
| 5,073,117 | 12/1991 | Malhi et al. | 439/71 |
| 5,086,337 | 2/1992 | Noro et al. | 357/79 |
| 5,088,190 | 2/1992 | Malhi et al. | 29/843 |
| 5,140,405 | 8/1992 | King et al. | 357/67 |
| 5,237,203 | 8/1993 | Massaron | 257/688 |
| 5,258,330 | 11/1993 | Khandros et al. | 437/209 |
| 5,258,648 | 11/1993 | Lin | 257/778 |
| 5,293,067 | 3/1994 | Thompson et al. | 257/668 |
| 5,302,853 | 4/1994 | Volz et al. | 257/707 |
| 5,303,466 | 4/1994 | Ozai et al. | 29/837 |
| 5,380,212 | 1/1995 | Smeenge, Jr. et al. | 439/86 |
| 5,389,819 | 2/1995 | Matsuoka | 257/727 |
| 5,398,863 | 3/1995 | Grube et al. | 228/106 |
| 5,427,535 | 6/1995 | Sinclair | 439/66 |
| 5,479,319 | 12/1995 | Werther | 439/69 |
| 5,562,462 | 10/1996 | Matsuba et al. | 439/70 |
| 5,593,322 | 1/1997 | Swamy et al. | 439/83 |
| 5,669,774 | 9/1997 | Grabbe | 439/70 |
| 5,742,481 | 4/1998 | Murphy et al. | 439/69 |
| 5,777,852 | 7/1998 | Bell | 439/69 |

OTHER PUBLICATIONS

Herard et al., "Interconnection Technology", *Flex Packaging*, vol. 18, No. 9, Sep., 1995, pp. 22–24.

Jarvela, "Module Holder and Actuator", *IBM Technical Disclosure Bulletin*, vol. 16, No. 12, May 1974, pp. 3975–3976.

John H. Lau, "A Brief Introduction to Ball Grid Array Technologies", *Ball Grid Array Technology*, 1995, pp. xii–i–xviii; 1–57.

*Primary Examiner*—Khiem Nguyen
*Assistant Examiner*—V. Johnson
*Attorney, Agent, or Firm*—Fish & Richardson P.C.

[57] ABSTRACT

A method of providing such an intercoupling component includes positioning terminals within holes of an insulative support member and attaching a solder ball to each of the terminals. Attaching the solder ball to the terminals is accomplished using a fixture having a number of recesses located in a pattern corresponding to a pattern of the holes in the insulative support member; filling each of the recesses with a solder ball; positioning the insulative support member over the fixture so that an end of each of the terminals contacts a corresponding solder ball; soldering the solder ball to the end of the terminal while maintaining the generally spherical shape of the solder ball; and removing the insulative support member from the fixture. The solder balls are generally soldered by passing the insulative support member with terminals and fixture with solder balls through a reflow apparatus.

2 Claims, 9 Drawing Sheets

SOLDER BALL TERMINAL

CROSS REFERENCE TO RELATED APPLICATIONS

This is a continuation-in-part application of co-pending application Ser. No. 08/694,740, filed Aug. 9, 1996, which is a continuation-in-part application of co-pending application Ser. No. 08/646,109, filed May 7, 1996.

BACKGROUND OF THE INVENTION

This invention relates to making connections between integrated circuit (IC) packages and circuit boards.

Ball grid array (BGA) packages are becoming increasingly popular because of their low profiles and high densities. The rounded solder ball contacts of a BGA are generally soldered directly to corresponding surface mount pads of a printed circuit board rather than to plated thru-holes which receive pins from, for example, a pin grid array IC package. However, once a BGA package is soldered to the printed circuit board, the soldered balls of the BGA package are difficult and expensive to inspect. Moreover, the packages are difficult to remove, for example, in situations where the IC package requires repairing or upgrading.

SUMMARY OF THE INVENTION

This invention relates to making a reliable low loss electrical interconnection between electrical contacts of individual substrates while duplicating the mating condition normally present between the solder ball of a ball grid array package (BGA) and an electrical contact area (e.g., surface mounted land) on one of the substrates. The term "substrate" is intended to mean any base member having electrical contact areas, including printed circuit boards, IC chip substrates or the packages supporting such chip substrates.

The electrical interconnection is provided with an intercoupling component (e.g., socket, adaptor or header assembly) including terminals which are positioned within an array of holes in an insulative support member and configured to electrically connect the array of connection regions of a substrate to an array of connection regions of another substrate. The array of holes in the support member are located in a pattern corresponding to the array of electrical connection regions of the substrate.

Soldering a BGA package to an intercoupling component is often preferable to soldering the package directly to a circuit board (e.g., motherboard). Using an intercoupling component facilitates removing the BGA package in situations where the package needs to be repaired or replaced. Moreover, because the intercoupling component generally has a lower mass than a motherboard, less heat is required to solder it to a BGA package; thus the BGA is subjected to less thermal stress.

In one application of the invention, an intercoupling component is in the form of a socket assembly which is soldered to a printed circuit board. The socket assembly receives another intercoupling component in the form of a pin adaptor assembly carrying a BGA package.

In one aspect of the invention, a method of providing such an intercoupling component includes positioning terminals within holes of an insulative support member and attaching a solder ball to each of the terminals. Attaching the solder ball to the terminals is accomplished using a fixture having a number of recesses located in a pattern corresponding to a pattern of the holes in the insulative support member; filling each of the recesses with a solder ball; positioning the insulative support member over the fixture so that an end of each of the terminals contacts a corresponding solder ball; soldering the solder ball to the end of the terminal while maintaining the generally spherical shape of the solder ball; and removing the insulative support member from the fixture. The solder balls are generally soldered by passing the insulative support member with terminals and solder balls through a reflow apparatus.

Each terminal element includes an elongated electrically conductive member having first and second ends, the first ends configured to be electrically connected to corresponding ones of the array of electrical connection regions disposed on the first substrate. The second ends of the terminals receive the solder balls.

Preferred embodiments of the above described inventions may include one or more of the following features for preventing the solder ball from melting around or along the side of the terminal when it is attached. For example, the holes may be sized to allow the second end of the terminals to be press-fit into the insulative support member so that only the surface of the second end of the terminals is exposed to the solder ball. The terminals may include solder resist coated around, but not on, the exposed surface of the second ends of the terminals. An insulative sheet member may be disposed over the lower surface of the support member and may include an array of holes sized to receive the second end of the terminals with a snug fit. The insulative sheet member may include a conductive circuit pattern (e.g., a ground plane or circuit traces).

Solder flux is provided to the second ends of the terminals. The terminals include, along their outer periphery, a pair of securing members. Upon being positioned within the insulative support member, a first one of the pair of securing members is positioned a length, relative to the upper surface of the support member, equal to about one-third the thickness of the insulative support member. Similarly, a second one of the pair securing members is positioned a length, relative to the opposite lower surface of the support member, equal to about one-third the thickness of the insulative support member.

In another aspect of the invention, the intercoupling component described above includes a pair of securing members disposed along the outer periphery of the terminal element. The terminal elements, upon being positioned within the insulative support member, include a first one of the pair securing members positioned a length, relative to the upper surface of the support member, equal to about one-third the thickness of the insulative support member. Similarly, a second one of the pair securing members is positioned a length, relative to the opposite lower surface of the support member, equal to about one-third the thickness of the insulative support member. In one embodiment, the first holes are sized to allow the second end of the terminal elements to be press-fit into the insulative support member so that substantially only the surface of the second end of the terminal elements are exposed. The intercoupling component also includes terminals having a solder ball, of the type normally used with BGA packages, preattached to at least one of the ends of the terminal. The solder ball electrically connects to an electrical connection region, such as a land of a substrate (e.g., printed circuit board). The other end of the terminal may also include a solder ball or may be adapted to electrically connect to a contact (e.g., pin terminal or socket terminal) of another substrate (e.g., pin adapter or socket).

The terminal with a preattached solder ball not only provides the desired mating condition of the solder ball to the circuit board, but is also solderable to a contact without having to apply additional solder paste or having to attach solder preforms to the ends of the socket terminals.

Other features and advantages of the invention will be apparent from the following description of the preferred embodiments and from the claims.

DETAILED DESCRIPTION

Figure 1:
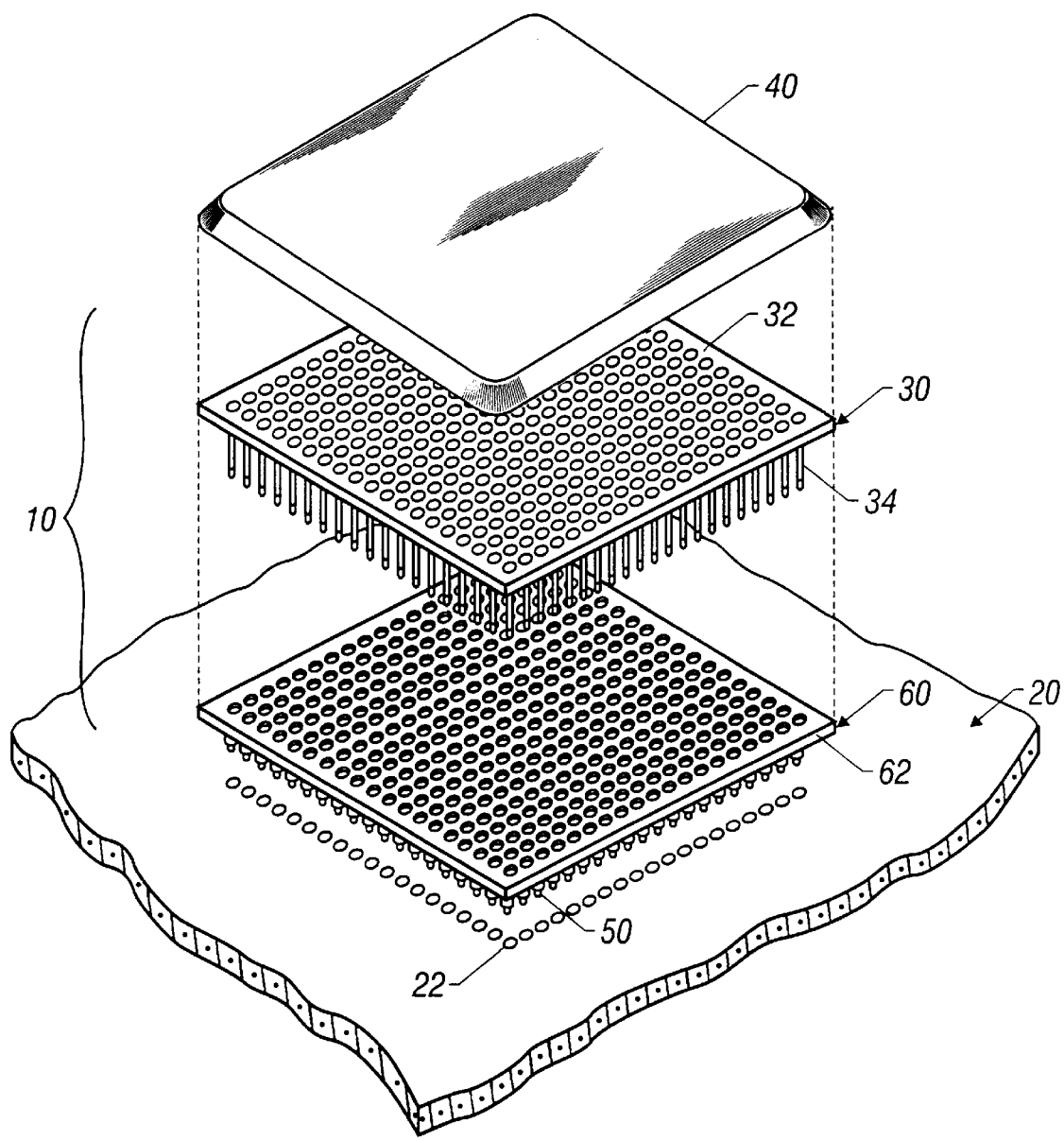
FIG. 1 is an exploded, somewhat diagrammatic, isometric view of an intercoupling component assembly for a ball grid array package.
Figure 2:
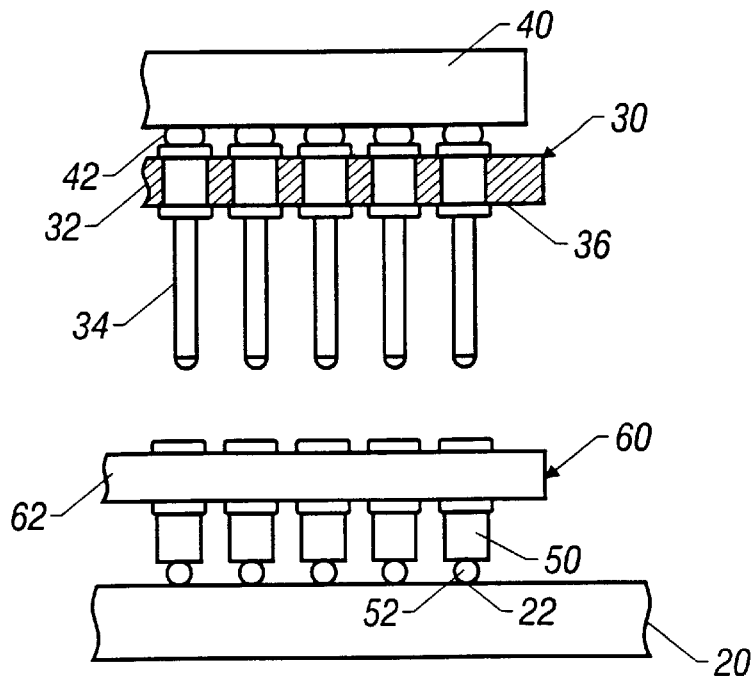
FIG. 2 is a side view of the intercoupling component of FIG. 1 having an adapter portion (in cross-section) and shown attached to a BGA package assembly.

Referring to FIGS. 1 and 2, an intercoupling component 10 is shown positioned to be connected to surface mount pads 22 of a printed circuit board 20. Adapter/socket assembly 10 includes a pin adapter 30 having an electrically insulative member 32 supporting pin terminals 34 positioned within an array of holes 36 in a pattern corresponding to a footprint of rounded solder balls 42 of a BGA package 40. When solder balls 42 of the BGA package are soldered to pin terminals 34 of pin adapter 30, the BGA package is converted to a high density pin grid array (PGA). Pin terminals 34 are received within socket terminals 50 of a socket 60. Socket 60 includes an insulative support member 62 for supporting the socket terminals positioned within an array of holes 64 (FIG. 3) in a pattern corresponding to the footprint of the surface mount pads 22.

Figure 3:
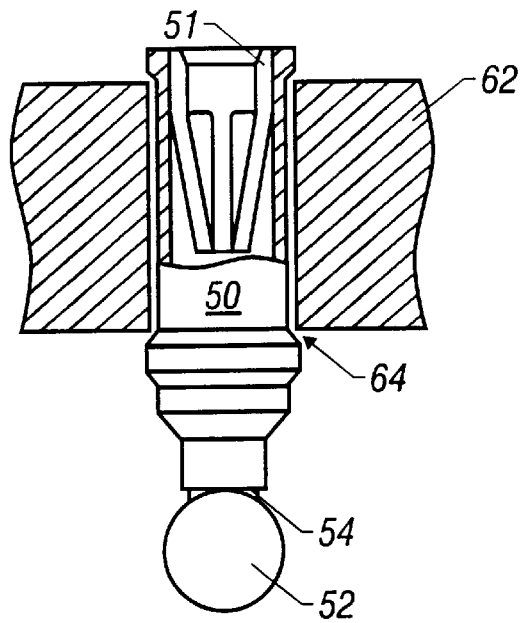
FIG. 3 is a cross-sectional side view of a portion of a terminal support assembly, with a terminal shown partially in cross section.

Referring to FIG. 3, socket terminals 50 are of the type having spring contacts 51 which receive and electrically connect to pin terminals 34 of pin adapter 30. Each socket terminal includes a solder ball 52 preattached to its bottom end 54 to provide an identical mating condition to lands 22 as would have been the case had BGA package 40 been connected directly to the printed circuit board. In other applications, solder balls may be attached to pin terminals, such as those described in co-pending application Ser. No. 08/646,109, filed May 7, 1996 and incorporated herein by reference.

Holes 64 of insulative support member 62 have a diameter slightly larger than the diameter of the terminal supporting the solder ball 52 to allow the terminal to slightly move or "float" in the vertical direction. Thus, when the terminals with preattached solder balls are soldered to contacting areas of PC board 50, the floating terminals compensate for any lack of coplanarity between the contacting areas.

Figure 4:
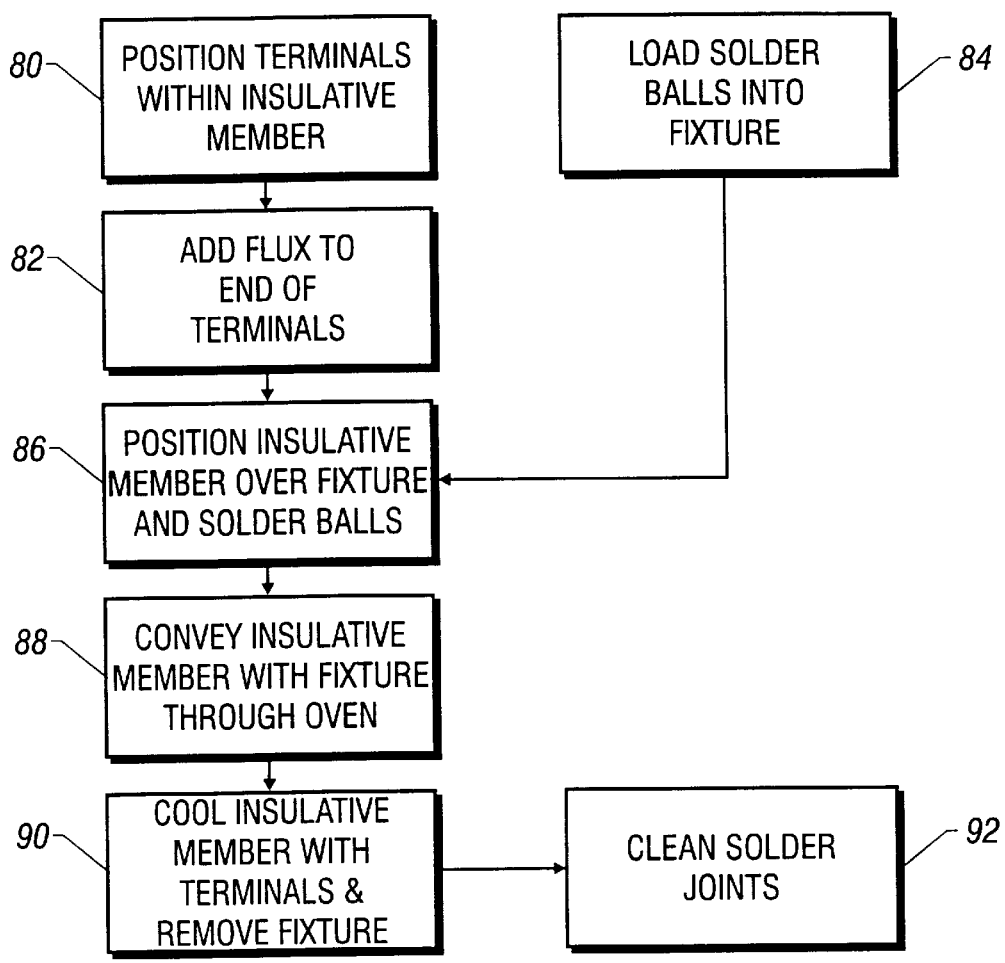
FIG. 4 is a flowchart illustrating an approach for assembling the intercoupling component of FIG. 1.

Referring to the flowchart of FIG. 4, a preferred approach for attaching a solder ball 52 to a terminal 50 of the type shown in FIG. 3 is shown. A vibration mechanism is generally used to initially position the individual terminals within holes 64. The terminals are then moved to a mechanism which seats the terminals so that they are fully positioned into holes 64 (step 80). Flux is then applied to the bottom ends of the individual terminals (step 82).

Figure 5:
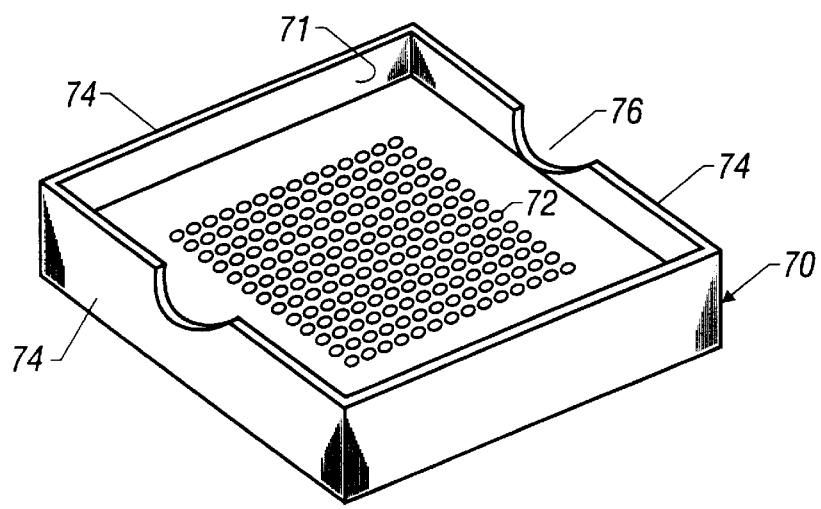
FIG. 5 is a perspective view of a fixture for supporting the solder balls to be attached to the terminals.

Referring to FIG. 5, an assembly fixture 70 formed of graphite and having rounded cavities 72, each of which receives a solder ball to be attached to the bottom end of a terminal. To fill each of the cavities with a solder ball, an indiscriminate number of the balls are poured into the fixture. The fixture is "jiggled" until each of the cavities accommodates a solder ball (step 84). Sidewalls 74 generally maintain the solder balls within the fixture and include cutouts 76 which allow excess solder balls to be emptied from the fixture when the fixture is tilted. The cavities are sized to allow the solder balls to extend slightly above the surface of fixture 70 where they contact the bottom end of the terminals.

Figure 6A:
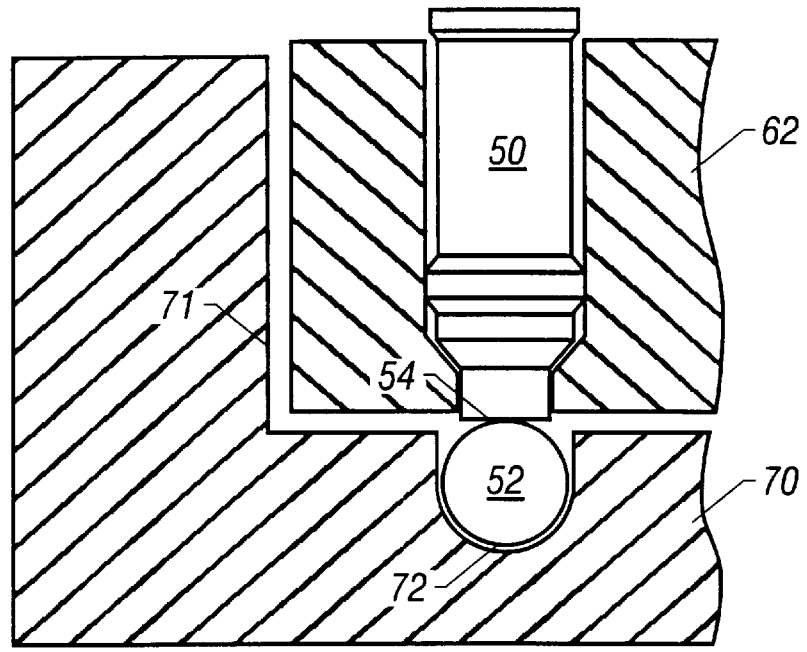
FIGS. 6A and 6B are cross-sectional side views of a portion of terminal support assembly and solder fixture prior to and after soldering, respectively.

Referring to FIG. 6A, with the cavities 72 filled with solder balls, the insulative support member 62 with terminals 50 is positioned within the assembly fixture 70 (step 86). Fixture 70 includes sidewalls 71 which are used to register the outer periphery of support member 62.

Figure 6B:
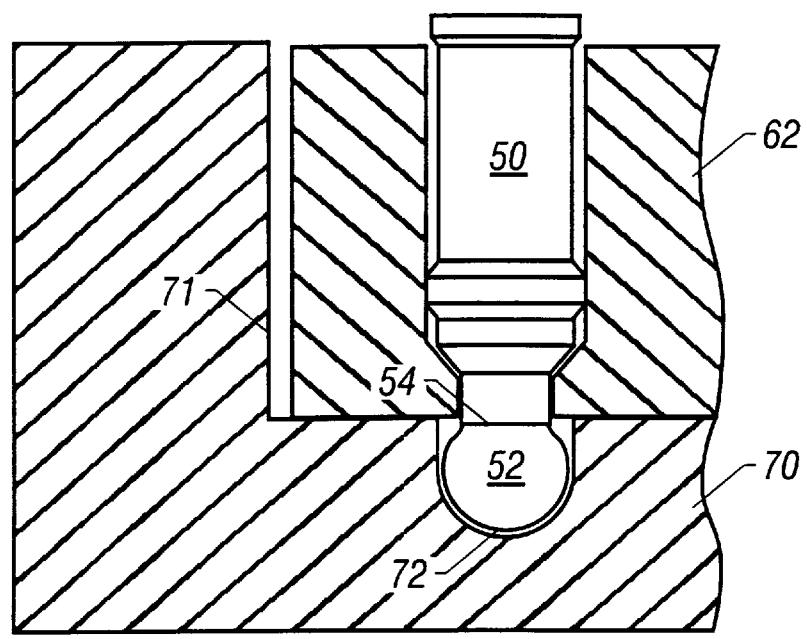

The insulative member and fixture are then passed through a reflow apparatus (e.g., infrared or convection oven) (step 88). The reflow apparatus is controlled to have a temperature profile which causes the solder ball to melt within cavities 72. Determining the temperature profile is largely an empirical process. The temperature profile used to solder the solder balls 52 to the ends of the terminals depends on a number of factors including: the style of terminal, the type of flux, plating conditions, the number and density of terminals placed in the insulative support member and the fixture design. The rounded shape of cavities 72 generally maintain the spherical shape of the solder balls when they melt. However, as shown in FIG. 6B, when the melt temperature of the solder balls is reached, the solder balls "slump" slightly around the terminal ends. Moreover, because the solder balls are positioned below the terminals, the solder balls do not slump or melt around the bottom ends of the terminals. Instead, attachment of the solder balls is limited to the bottom ends 54 of the terminals. When the solder ball has reflowed and is attached to its terminal the insulative member and fixture are removed from the oven and allowed to cool to room temperature (step 90). The fixture is detached from the now-assembled terminal support assembly and the solder joints between the balls and terminals are ultrasonically cleaned to remove excess flux (step 92).

In certain assembly procedures, the insulative member and terminals may be positioned below the assembly fixture which supports the solder balls. In this inverted position, the solder balls are positioned over the bottom end of the terminal instead of under the bottom end of the terminal as was the case in FIGS. 6A and 6B. In these circumstances, it has been observed that if the flux is allowed to flow down and along the sides of the terminal, the reflowed solder ball may not maintain its round shape. Instead the ball melts and collapses around the bottom end of the terminal or disproportionately over one side of the terminal.

Figure 7:
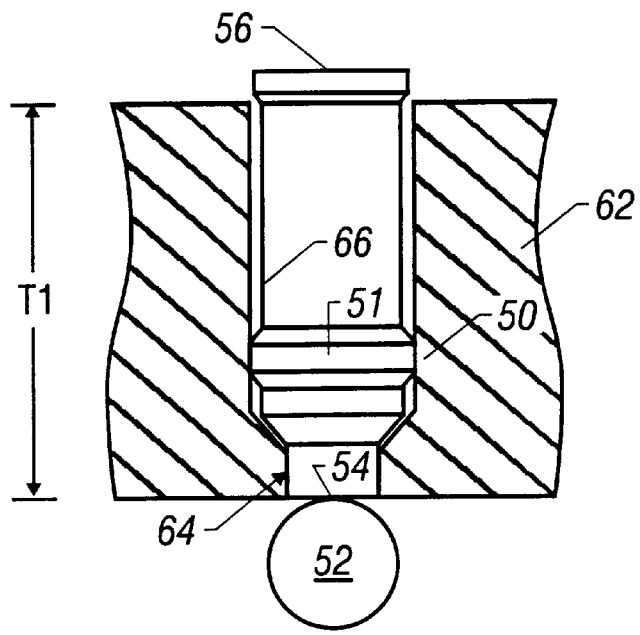
FIG. 7 is a cross-sectional side view of a portion of an alternate embodiment of a terminal support assembly.

Referring to FIG. 7, in another embodiment, this problem is addressed by selecting the thickness (T1) of insulative support member 62 so that when the individual terminals are fully positioned within the holes of the insulative member, the top ends 56 of the terminals contact the top surface of the insulative member and the bottom ends 54 of the terminals extend only to the lower surface of the insulative member. Holes 64 are sized at the bottom surface of the insulative support member 62 to have a relatively snug fit between the bottom ends of the terminals and the holes. The close fit ensures that solder and/or flux does not flow along the outer side surfaces of the terminal element. Holes 64 include counterbores 66 with a diameter slightly larger than the diameter of ring 51 of the terminal and smaller than the head 56 of the terminal. The oversized counterbores facilitate loading the terminals within the insulative support member. In some embodiments, the bottom end of the terminal may include a counterbore sized to facilitate positioning of the solder ball to the terminal. With this configuration, the solder ball melts to fill the counterbore, thereby providing a generally more reliable mechanical connection to the terminal.

Figure 8:
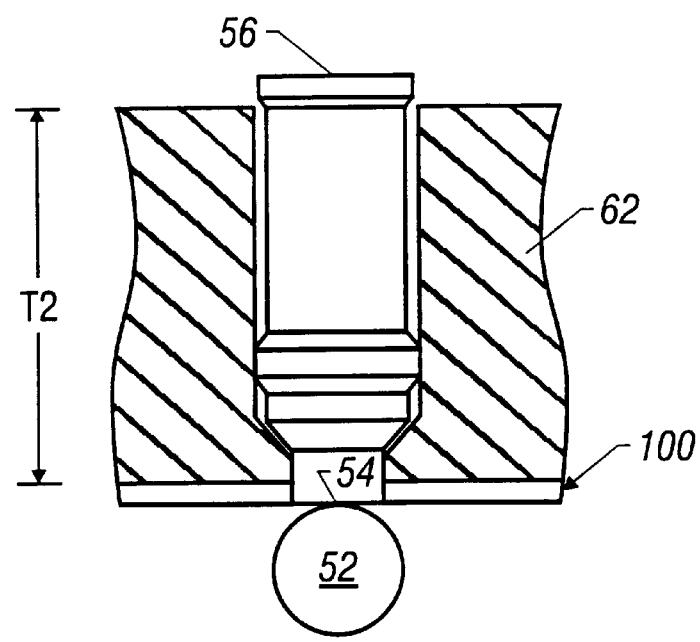
FIG. 8 is a cross-sectional side view of a portion of another embodiment of a terminal support assembly.

Referring to FIG. 8, in another embodiment for preventing flux and/or solder to flow along the sides of the terminals, a thin sheet of polyimide film 100 (e.g., 5–7 mils), is positioned over insulative support member 62. The polyimide film may be, for example, a Kapton® (a registered trademark of E.I. DuPont de Nemours & Co., Wilmington, Del.) sheet. In this embodiment, the thickness (T2) of the insulative support member is selected so that when the individual terminals are fully positioned within the holes of the insulative member, the top ends 56 of the terminals contact the top surface of the insulative member and the bottom ends 54 of the terminals extend slightly beyond the lower surface of the support member a distance approximately that of the thickness of the film 100. The polyimide film includes an array of holes corresponding to the array of holes in the insulative member and is positioned over the lower surface of the insulative member 62. The polyimide film serves as a barrier to any flux which might otherwise flow along the sides of the terminal elements.

Figure 9:
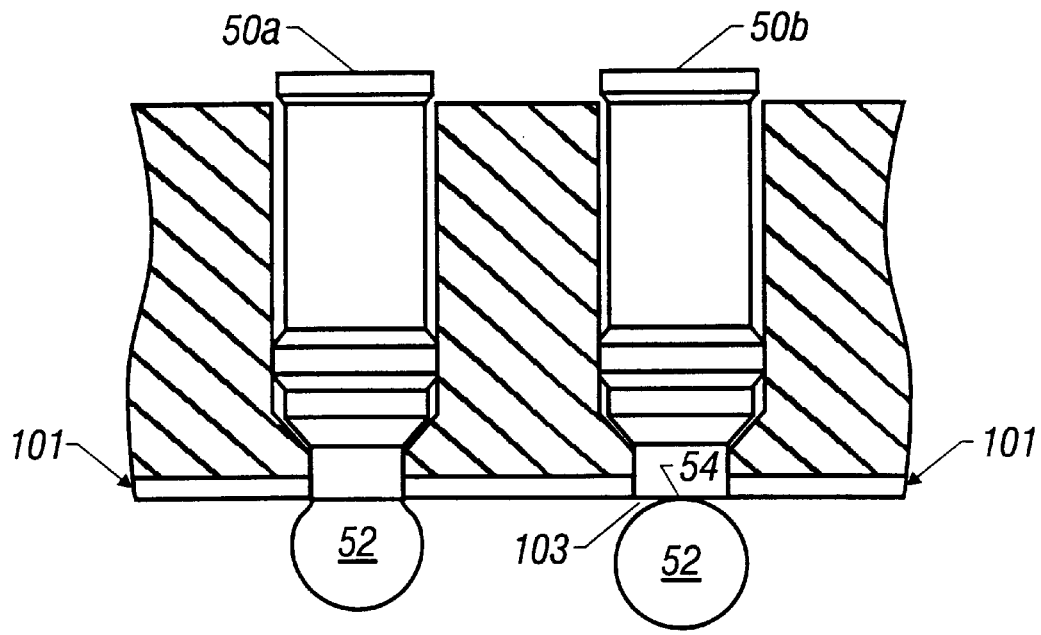
FIG. 9 is a cross-sectional side view of a portion of still another embodiment of a terminal support assembly.
Figure 10:
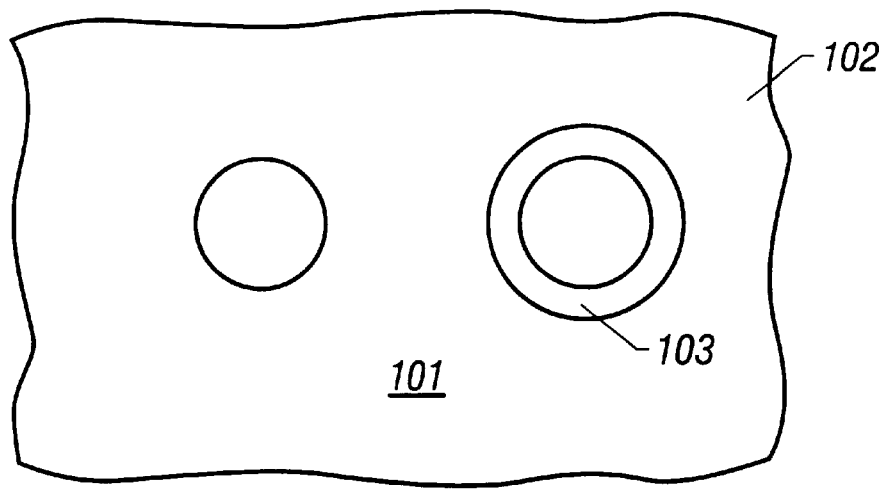
FIG. 10 is a plan view of the portion of the terminal support assembly of FIG. 9.

The polyimide film may also be used to support circuitry. For example, referring to FIGS. 9 and 10, a polyimide film 100 has a conductive layer 101 which is etched to form a conductive circuit pattern 102 in the form of a ground plane. In this embodiment, a first terminal 50a is electrically connected to ground plane 102 while a second terminal 50b is isolated from the ground plane by etching away a circular ring 103 of the conductive layer. In other applications, the conductive circuit may be in the form of individual circuit traces.

Figure 11:
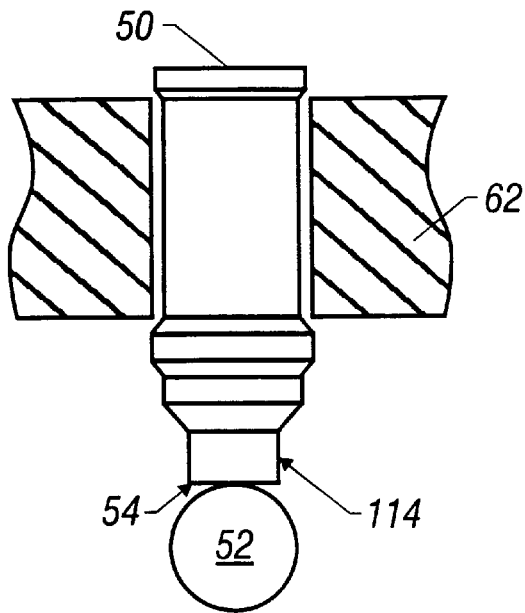
FIG. 11 is a cross-sectional side view of a portion of still another embodiment of a terminal support assembly.

Referring to FIG. 11, in another embodiment, preconditioned flux is prevented from flowing to other areas of the terminal by applying solder resist 114 to the entire lower end of the terminal with the exception of the surface of the bottom end. The solder resist may be sprayed, dipped or applied as a paste to the lower end of the terminal with bottom end 54 masked.

Figure 12:
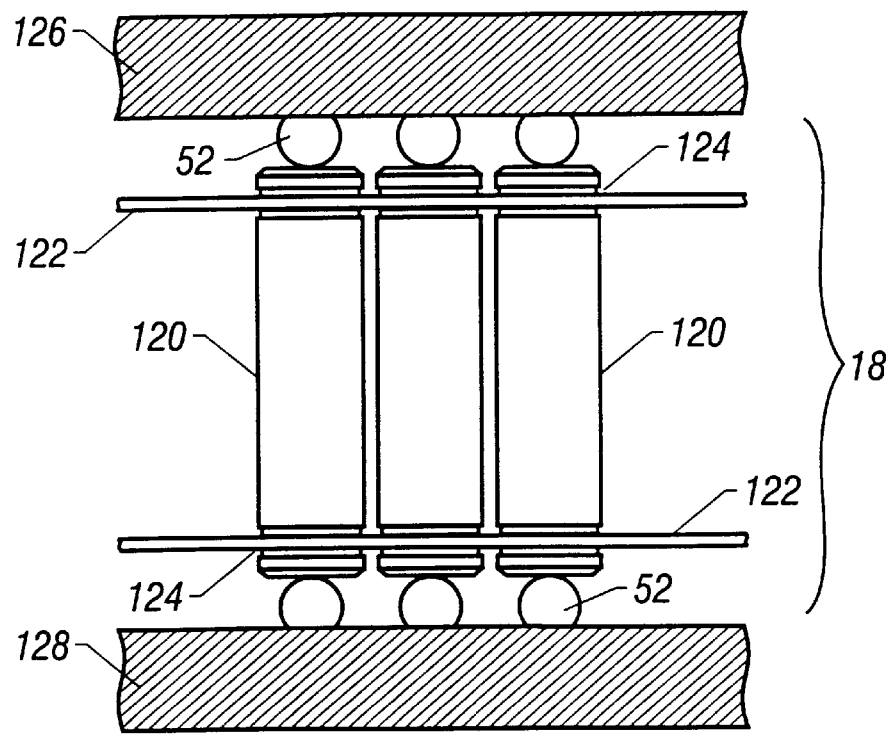
FIG. 12 is a side view of an alternate embodiment of an intercoupling component.

Other embodiments are within the following claims. For example, referring to FIG. 12, an intercoupling component 118 includes terminals 120 configured to receive solder balls 52 at their top and bottom ends. The terminals are supported on a pair of thin sheets 122 which are approximately 0.127 mm (0.005 inch) thick and are formed of a material such as Kapton™ which is flexible and electrically insulative. The ends of each terminal includes a V-shaped groove 124 which extends around the periphery of the terminal for engaging the edge of the polymeric film. Sheets 122 serve as a carrier for grouping, in a pre-selected spaced relationship, the terminals. Details in fabricating a carrier sheet which supports terminals is described in U.S. Pat. No. RE32,540, assigned to the assignee of the present invention. As shown in FIG. 12, the intercoupling component 118 serves as a header for connecting a pair of printed circuit boards 126 and 128.

Figure 13:
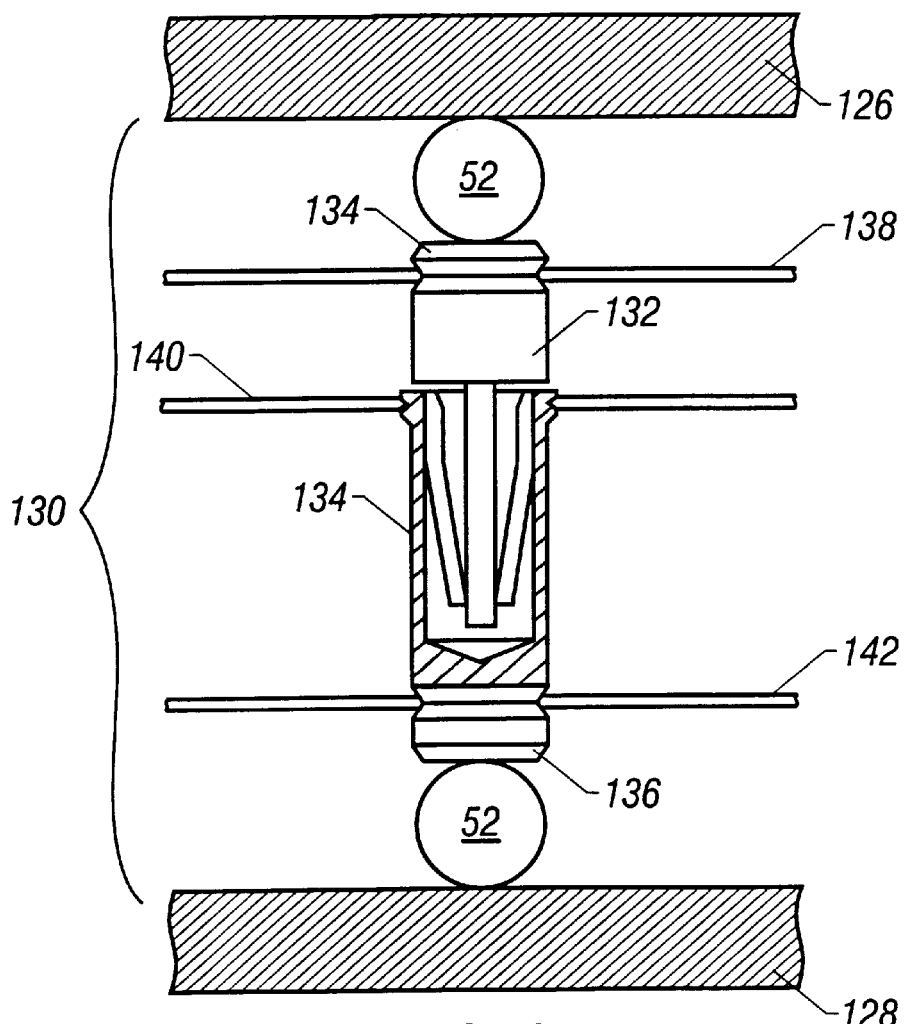
FIG. 13 is a cross-sectional side view of an alternate embodiment of the intercoupling component of FIG. 12.

Referring to FIG. 13, an intercoupling component 130 similar to that shown in FIG. 12 can be provided in the form of a separable header. That is, the terminals positioned between circuit boards 126 and 128 include a terminal pin 132 having a solder ball preattached to its top end 134. Terminal pin 132 mates with a terminal socket 134 having a solder ball preattached to its bottom end 136. Terminal pin 132 is supported on a carrier sheet 138 while terminal socket 134 is supported at each of its ends on carrier sheets 140, 142.

Referring to FIGS. 14A–14D, an approach for assembling a terminal socket of the type described above is shown.

Figure 14A:
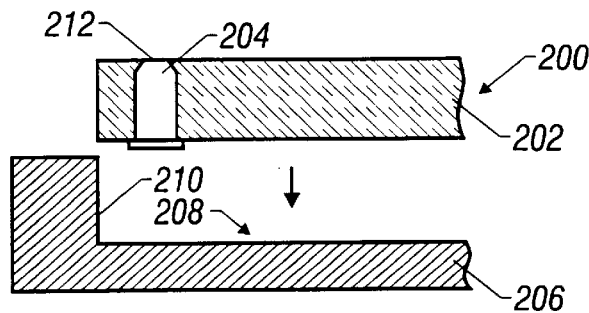
FIGS. 14A–14D illustrate one approach for assembling a terminal support assembly, such as that shown in FIG. 7.

Referring to FIG. 14A, a socket assembly 200 includes an insulative support member 202 having terminal sockets 204 positioned within corresponding holes formed within the support member. Terminal sockets are positioned in support member 202 in the manner, for example, described in greater detail below in conjunction with FIG. 15. Although, for simplicity sake, only a single terminal socket 204 is shown in the figures, it is to be understood that support member 202 includes as many terminal sockets as the package requires. Support member 202 with terminal sockets 204 is positioned within a fixture 206 having a cavity 208 defined by sidewalls 210 and sized commensurate with the outer periphery of the support member.

Figure 14B:
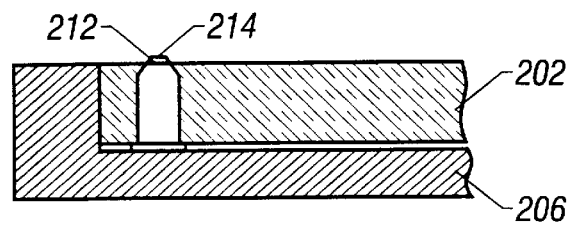

Referring to FIG. 14B, exposed ends 212 of terminal sockets 204 are provided with a thin layer of solder flux 214 (not to scale in figure). Solder flux 214 may be provided using any of a variety techniques including screen printing techniques.

Figure 14C:
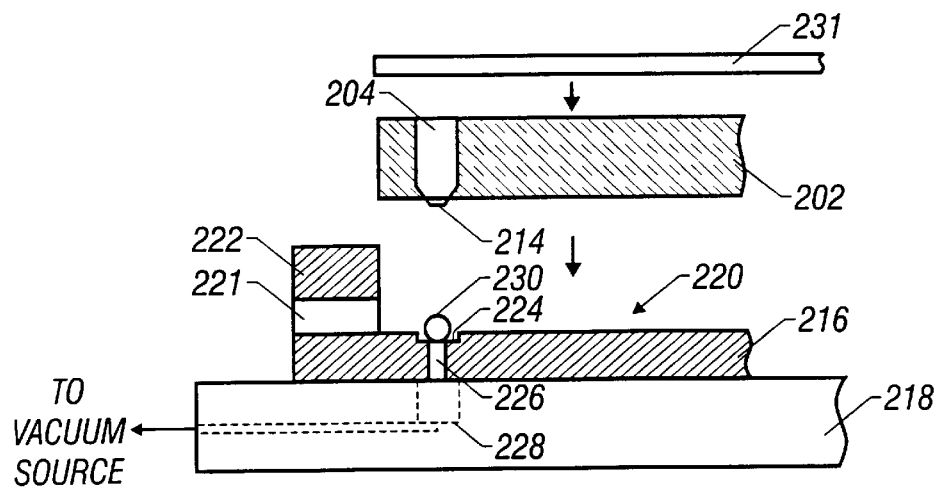

Referring to FIG. 14C, support member 202 is then removed from fixture 206 and placed within a ball positioning fixture 216 which, in turn, is positioned over a vacuum/shaker mechanism 218. Ball positioning fixture 216 includes an open cavity 220 defined by sidewalls 222 and sized commensurate with the outer periphery of the support member. Cavity 220 includes an array of recesses 224 corresponding to the array of terminal sockets 204, each recess having a vacuum channel 226 extending through fixture 216 and aligned with a vacuum port 228 of vacuum/shaker mechanism 218. Vacuum port 228 leads to a vacuum source (not shown).

In operation, solder balls 230 are loaded (e.g., poured) within fixture 216 and the vacuum/shaker mechanism is activated to cause the solder balls to be drawn into each of recesses 224 of cavity 220. An exit port 221 is provided within a sidewall of fixture 216 to allow excess solder balls to be removed from the fixture. When each of recesses 224 has a solder ball 230 positioned therein, shaking from the shaker/vacuum mechanism is discontinued. Vacuum is preferably maintained to ensure that solder balls 230 remain within recesses 224. Support member 202 is then placed within ball positioning fixture 216 so that ends 212 of terminal sockets 204 contact solder balls 230.

A cover plate 231 is positioned over support member 202 and vacuum is removed. Cover plate 231 and the support member 202 is then inverted or "flipped" (with or without ball positioning fixture 216). Cover plate 231 facilitates inverting support member 202 in a manner that prevents solder balls 230 from falling off ends 212. The viscosity of solder flux 214 allows contributes in maintaining the position of solder balls 230 on ends 212.

Figure 14D:
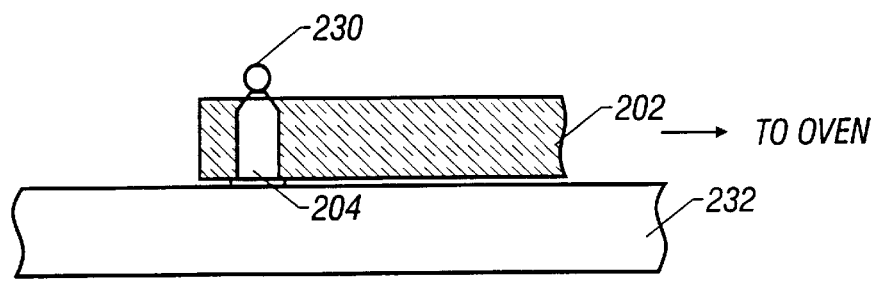

Referring to FIG. 14D, support member 202 and cover plate 231 are then passed through a reflow apparatus (e.g., infrared or convection oven), for example, by placing it on a conveyor belt 232 passing through the reflow apparatus. The reflow apparatus is controlled to have a temperature and speed profile which causes solder balls 230 to slightly slump over ends 212 while maintaining their generally spherical shape.

Figure 15:
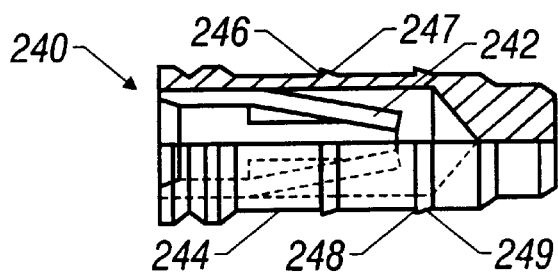
FIG. 15 is a side view, partially in cross sectional, of an alternate embodiment of a terminal.

Referring to FIG. 15, a socket terminal 240 is shown which is particularly well-suited for being press-fit within support member 202 using the assembly procedure described above in conjunction with FIGS. 14A–14D. Socket terminal 240 is similar to socket terminal 50 (FIG. 3) in that they both include a spring contact 242 for receiving and electrically connecting to a pin terminal of a pin adapter. Socket terminal 240 includes a shell portion 244 having a pair of barb-like rings 246, 248 extending around the periphery of the shell portion. Barb-like rings 246, 248 serve to secure the socket terminal within corresponding holes of the support member 202. Specifically, barb-like rings 246, 248 each have a tapered seating surface 247, 249 to facilitate insertion of the rings within support member 202 while impeding removal of the socket terminal within the support member once in place.

The relative positions of barb-like rings 246, 248 along the axial length of socket terminal is important. Specifically, ring 246 is positioned, from a first end of the socket terminal, a length (e.g., about 0.032 inches) approximately one-third the total thickness of the support member (e.g., 0.095 inches). Similarly, ring 248 is positioned, from an opposite end of the socket terminal, a length (e.g., about 0.032 inches) approximately one-third the total thickness of the support member. Positioning rings 246, 248 in this manner, minimizes bending or warping of support member 202 due to forces imparted by socket terminals when press-fit within the support member. The position of rings 246, 248 relative to the thickness of support member 202 allows the radial forces to be more evenly distributed to the support member. Although, barb-like rings 246, 248 extend entirely around the periphery of shell portion 244, in other embodiments, the rings may be in the form of arc-shaped segments. Further, although the use of barb-like rings 246, 248 has been described in conjunction with a socket terminal having a contact spring, use of the rings is equally applicable with other forms of terminals including pin terminals.

What is claimed is:

1. An intercoupling component of the type used to couple an array of electrical connection regions disposed on a first substrate to an array of electrical connection regions disposed on a second substrate, the intercoupling component comprising:

an insulative support member having an upper surface and an opposite lower surface, the support member including an array of first holes extending transversely from the upper surface to the opposite lower surface, the array of first holes located in a pattern corresponding to the array of the electrical connection regions of the first substrate; and a plurality of terminal elements, press-fit within the first holes and configured to electrically connect the array of connection regions of the first substrate to the array of connection regions of the second substrate, wherein each of the terminal elements comprise:

an electrically conductive member having first and second ends, the first end adapted to be connected to a corresponding one of the array of electrical connection regions disposed on the first substrate;

a solder ball preattached to a surface of the second end of the conductive member, the solder ball adapted to be reflowed to connect the terminal element to a corresponding one of the array of connection regions disposed on the second substrate; and a pair of securing members disposed along the outer periphery of the terminal element, wherein the terminal elements, upon being positioned within the insulative support member, including a first one of the pair securing members positioned a length, relative to the upper surface of the support member, equal to about one-third the thickness of the insulative support member, and a second one of the pair securing members is positioned a length, relative to the opposite lower surface of the support member, equal to about one-third the thickness of the insulative support member.

2. The intercoupling component of claim 1 wherein the first holes are sized to allow the second end of the terminal elements to be press-fit into the insulative support member so that substantially only the surface of the second end of the terminal elements are exposed.

* * * * *

UNITED STATES PATENT AND TRADEMARK OFFICE
CERTIFICATE OF CORRECTION

PATENT NO. : 6,007,348
DATED : DECEMBER 28, 1999
INVENTOR(S) : JAMES V. MURPHY

It is certified that error appears in the above-identified patent and that said Letters Patent is hereby corrected as shown below:

Cover page, [73] Assignee: "Advanced Intercommunications Corporation" should be --Advanced Interconnections Corporation--.

Signed and Sealed this

Twenty-fourth Day of April, 2001

Attest:

NICHOLAS P. GODICI

Attesting Officer

Acting Director of the United States Patent and Trademark Office